(12) United States Patent
Kao et al.

(10) Patent No.: US 8,779,539 B2
(45) Date of Patent: Jul. 15, 2014

(54) IMAGE SENSOR AND METHOD FOR FABRICATING THE SAME

(75) Inventors: Ching-Hung Kao, Hsinchu County (TW); Hsin-Ping Wu, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 182 days.

(21) Appl. No.: 13/238,076

(22) Filed: Sep. 21, 2011

(65) Prior Publication Data
US 2013/0069190 A1 Mar. 21, 2013

(51) Int. Cl.
*H01L 31/0232* (2014.01)
*H01L 27/146* (2006.01)

(52) U.S. Cl.
CPC .... *H01L 27/14636* (2013.01); *H01L 27/14689* (2013.01); *H01L 27/1464* (2013.01); *H01L 27/1463* (2013.01); *H01L 27/14687* (2013.01)
USPC .................................. 257/432; 257/E31.127

(58) Field of Classification Search
CPC ..................... H01L 27/1463; H01L 27/14636; H01L 27/14689; H01L 27/14687; H01L 27/1464
USPC ........ 257/432, E31.032, E31.127; 438/70, 73
See application file for complete search history.

(56) References Cited

U.S. PATENT DOCUMENTS

| 2006/0180885 | A1 | 8/2006 | Rhodes | |
|---|---|---|---|---|
| 2006/0258042 | A1 | 11/2006 | Roy et al. | |
| 2007/0187734 | A1 | 8/2007 | Adkisson et al. | |
| 2008/0042175 | A1* | 2/2008 | Abe et al. | 257/292 |
| 2008/0197436 | A1* | 8/2008 | Uya | 257/432 |
| 2009/0200590 | A1* | 8/2009 | Mao et al. | 257/292 |
| 2010/0078752 | A1* | 4/2010 | Hwang | 257/459 |
| 2010/0155796 | A1* | 6/2010 | Koike et al. | 257/292 |
| 2010/0237451 | A1* | 9/2010 | Murakoshi | 257/432 |
| 2011/0079866 | A1* | 4/2011 | Nishizawa et al. | 257/431 |
| 2011/0084350 | A1* | 4/2011 | Murakoshi et al. | 257/432 |
| 2011/0097840 | A1* | 4/2011 | Ramappa | 438/87 |
| 2011/0108939 | A1* | 5/2011 | Marty et al. | 257/432 |

* cited by examiner

*Primary Examiner* — Vongsavanh Sengdara
(74) *Attorney, Agent, or Firm* — WPAT, PC; Justin King

(57) ABSTRACT

An image sensor comprises a substrate, a plurality of photoelectric transducer devices, an interconnect structure, at least one dielectric isolator and a back-side alignment mark. The substrate has a front-side surface and a back-side surface opposite to the front-side surface. The interconnect structure is disposed on the front-side surface. The photoelectric transducer devices are formed on the front-side surface. The dielectric isolator extends downwards into the substrate from the back-side surface in order to isolate the photoelectric transducer devices. The back-side alignment mark extends downwards into the substrate from the back-side surface and references to a front-side alignment mark previously formed on the front-side surface.

7 Claims, 6 Drawing Sheets

IMAGE SENSOR AND METHOD FOR FABRICATING THE SAME

FIELD OF THE INVENTION

The present invention relates to a semiconductor device and the method for fabricating the same, more particularly to an image sensor and the method for fabricating the same.

BACKGROUND OF THE INVENTION

An image sensor, such as a metal-oxide-semiconductor (MOS) image sensor is a photoelectric device which can convert optical images into electrical signals and has been widely applied in various consumer products such as, digital cameras, camcorders, personal communication systems (PCSs), game equipment, requiring for improved image resolution.

In order to satisfy the demands for finer image resolution capabilities, it is necessary to increase the pixel integration of MOS image sensors, and the size and pixel pitch of the constituent photoelectric transducer device, (e.g., a photodiode) shall be shrank. However, reduction in the physical size and pixel pitch of the photoelectric transducer devices may result in electrical and optical crosstalk between two adjacent photoelectric transducer devices, the sensitivity of the MOS image sensor is thus correspondingly reduced and, in the worst case, image distortion may occur.

Shallow trench isolations (STI) which are typically formed between two adjacent photoelectric transducer device in a conventional image sensor have been adopted by the prior art to reduce the possibility of electrical crosstalk. However, the STI which has limited depth may not possible to satisfactorily provide an electrical crosstalk barrier. Furthermore, the STI does not provide an effective optical crosstalk barrier when a backside image sensor is fabricated.

Therefore, it is necessary to provide an advanced image sensor and the fabricating method thereof to obviate the drawbacks and problems encountered from the prior art.

SUMMARY OF THE INVENTION

In accordance with one aspect of the present invention, an image sensor comprises a substrate, a plurality of photoelectric transducer devices, an interconnect structure, at least one dielectric isolator and a back-side alignment mark. The substrate has a front-side surface and a back-side surface opposite to the front-side surface. The interconnect structure is disposed on the front-side surface. The photoelectric transducer devices are formed on the front-side surface. The dielectric isolator extends downwards into the substrate from the back-side surface in order to isolate the photoelectric transducer devices. The back-side alignment mark extends downwards into the substrate from the back-side surface and references to a front-side alignment mark previously formed on the front-side surface.

In one embodiment of the present invention, the dielectric isolator comprises a plurality of anti-reflective coating (ARC) layers. In some embodiments of the present invention, the image sensor further comprises an ion doping layer disposed in the substrate and surrounding the dielectric isolator.

In some embodiments of the present invention, the image sensor further comprises a STI extending downwards into the substrate from the front-side surface and connecting to the dielectric isolator. In some embodiments of the present invention, the back-side alignment mark directly aligns to the front-side alignment mark or makes a reference to the front-side alignment mark by a predetermined spatial relation.

In some embodiments of the present invention, the image sensor further comprises a color filter and a plurality of lenses disposed on the back-side surface. In some embodiments of the present invention, the image sensor further comprises a metal shielding layer disposed between the color filter and the dielectric isolator. In some embodiments of the present invention, the back-side alignment mark comprises a recess extending downwards into the substrate from the back-side surface. In some embodiments of the present invention, the back-side alignment mark further comprises a dielectric layer and a metal shielding layer disposed on the bottom and the sidewalls of the recess.

In accordance with another aspect of the present invention, a method for fabricating an image sensor is provided, wherein the method comprises steps as follows: A plurality of photoelectric transducer devices and an interconnect structure are formed on a front-side surface of a substrate. At least one dielectric isolator extending downwards into the substrate from a back-side surface of the substrate opposite to the back-side surface is then formed in order to isolate the photoelectric transducer devices. And a back-side alignment mark extending downwards into the substrate from the back-side and referencing to a front-side alignment mark previously formed on the front-side surface is formed.

In some embodiments of the present invention, the dielectric isolator and the back-side alignment mark are formed simultaneously. In some embodiments of the present invention, the formation of the dielectric isolator and the back-side alignment mark comprises following steps: An etching process is firstly performed on the back-side surface to form at least one deep trench and a recess in the substrate. A dielectric layer is then formed to fulfill the deep trench and partially fill the recess. Subsequently, a planarization process is performed to remove a portion of the dielectric layer in order to expose a portion of the substrate. In some embodiments of the present invention, the deep trench exposes a STI previously formed on the front-side surface.

In some embodiments of the present invention, the method further comprises performing an ion implantation process and a laser annealing process after the formation of the deep trench and the recess. In some embodiments of the present invention, the method further comprises forming a hard mask on the back-side surface prior the etching process is carried out.

In some embodiments of the present invention, after the planarization process is performed the method further comprises steps of performing a surface treatment on the substrate and the back-side alignment mark; forming a metal layer on the substrate, the dielectric isolator and the back-side alignment mark; and patterning the metal layer to form a metal shielding layer overlaying on the dielectric isolator and the back-side alignment mark. In some embodiments of the present invention, the surface treatment comprises steps of performing an ion plantation process and a laser annealing process on the substrate, the dielectric isolator and the back-side alignment mark; and forming an ARC layer on the substrate, the dielectric isolator and the back-side alignment mark.

In some embodiments of the present invention, the back-side alignment mark aligns to the front-side alignment mark or makes a reference to the front-side alignment mark by a predetermined spatial relation. In some embodiments of the present invention, the method further comprises steps of forming a color filter and a plurality of lenses on the back-side surface and the dielectric isolator, after the dielectric isolator and the back-side alignment mark are formed.

In some embodiments of the present invention the method further comprises steps of attaching a working wafer on the interconnect structure and performing a thinning process on the back-side surface to thin the substrate down, prior to the dielectric isolator is formed.

In accordance with another aspect of the present invention, a method for fabricating an image sensor is provided, wherein the method comprises steps as follows: A plurality of photoelectric transducer devices and an interconnect structure are formed on a front-side surface of a substrate. An etching process is then performed on a back-side surface of the substrate to form at least one deep trench in the substrate. Subsequently, a dielectric layer is then formed to fulfill the deep trench, whereby at least one dielectric isolator extending downwards into the substrate from a back-side surface of the substrate is then formed in order to isolate the photoelectric transducer devices, and the dielectric layer is remained as-deposited.

In accordance with the aforementioned embodiments of the present invention, an image sensor and the fabricating method thereof are provided, wherein a plurality of photoelectric transducer devices and an interconnect structure are firstly formed on a front-side surface of a substrate. At least one dielectric isolator extending downwards into the substrate from a back-side surface of the substrate opposite to the back-side surface is then formed in order to isolate the photoelectric transducer devices, whereby both of the incident light passing into the substrate and the photo-carriers generated in the substrate can be effectively isolated. Therefore, the electrical and optical crosstalk between two adjacent photoelectric transducer devices can be avoided.

In addition, because the formation of the dielectric isolator and the front-side process for forming the photoelectric transducer devices and the interconnect structure are respectively performed on opposite surface of the substrate, the high temperature generated by the liner oxidation process and the gap-fill material densification process for fabricating the dialectic isolator may not interfere the performance of two adjacent photoelectric transducer devices, and the quality of the interconnect structure which is formed on the front-side surface shall not be adversely affect by a u-scratch resulted from the planariztion process (e.g. a chemical mechanical polishing process) performed on the back-side surface.

Furthermore, since a back-side alignment mark referencing to a front-side alignment mark previously formed on the front-side surface of the substrate for the front-side process can be simultaneous with the formation of the dielectric isolator on the back-side surface by the same steps, thus the subsequent process can be performed more precisely without performing any additional process. In other words, the processing accuracy of the image sensor can be significantly increased without increasing any additional cost.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention is to provide an image sensor and the method for fabricating the same to avoid the problems of electrical and optical crosstalk, meanwhile, the processing accuracy of the image sensor can be significantly increased. The present invention will now be described more specifically with reference to the following embodiment for fabricating a MOS image sensor 100. It is to be noted that the following descriptions of preferred embodiments of this invention are presented herein for purpose of illustration and description only. It is not intended to be exhaustive or to be limited to the precise form disclosed.

Figure 1A:
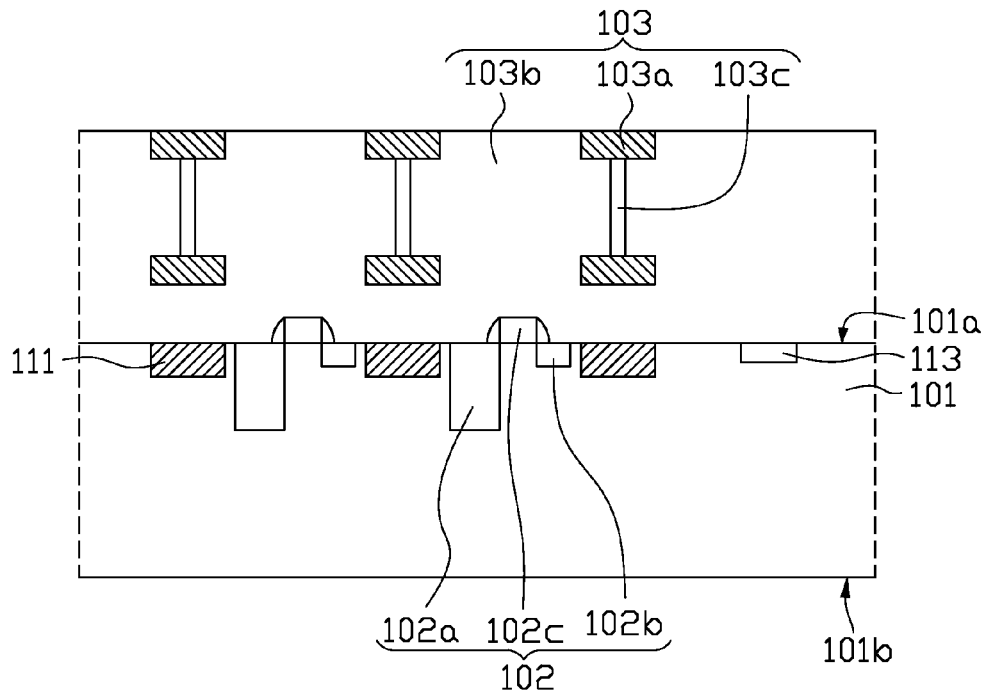
FIGS. 1A to 1J are cross sectional views illustrating a method for fabricating a MOS image sensor in accordance with one embodiment of the present invention.
Figure 1B:
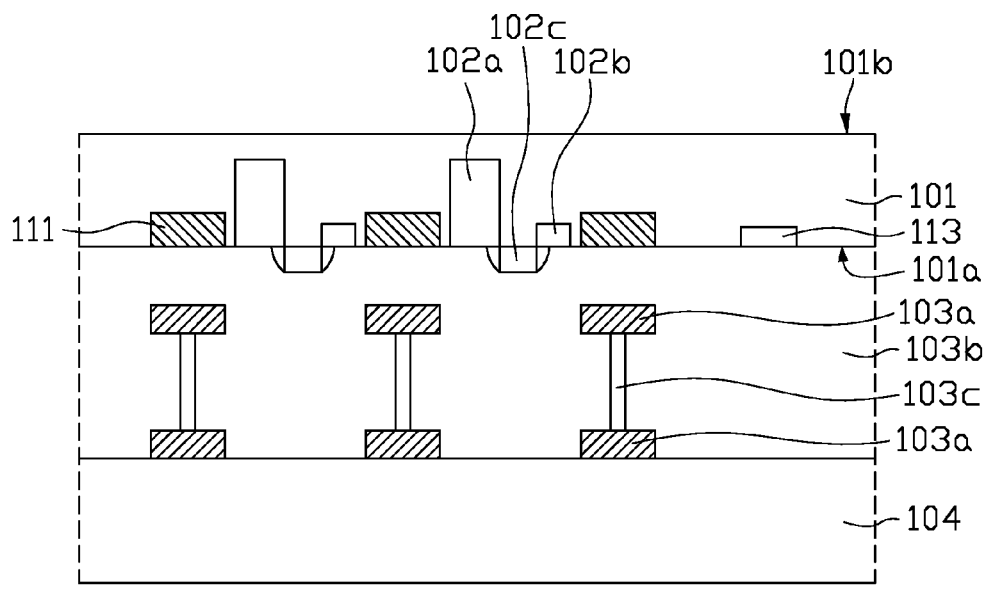

FIGS. 1A to 1J are cross sectional views illustrating a method for fabricating a MOS image sensor 100 in accordance with one embodiment of the present invention. As shown in FIG. 1A, a substrate 101 having a front-side surface 101a and a back-side surface 101b opposite to the front-side surface 101a is firstly provided. A front-side process is then performed on the front-side surface 101a to form a plurality of photoelectric transducer devices 102 on the front-side surface 101a of the substrate 101. An interconnect structure 103 is subsequently formed on the front-side surface 101a and electrically connects to the photoelectric transducer devices 102.

In some preferred embodiments of the present invention, the substrate 101 may be a silicon substrate. In some other embodiments of the present invention, the substrate 101 may be, otherwise, a silicon-on-insulator (SOI). The plurality of the photoelectric transducer devices 102 are divided by a plurality of STIs 111 which are formed on the front-side surface 101a and extending downwards in to the substrate 101. Each of the photoelectric transducer devices 102 comprises a photodiode 102a, a drain 102b and a gate structure 102c, wherein the photodiode 102a and the drain 102b are both embedded in the substrate 101 and the gate structure 102c is formed on the front-side surface 101a. The interconnect structure 103 is a stacked structure constituted by a plurality of metal layers 103a stacked in sequence, a dielectric layer 103b used to isolate the metal layers 103a and at least one conductive via 103c used to electrically connect with two of the metal layers 103a.

It should be appreciated that the interconnect structure 103 consisting of the metal layers 103a, the dielectric layer 103b and the conductive via 103c as shown in FIG. 1A is merely illustrative. Various interconnect structures having circuit integrity and line width the same with or different from that of the interconnect structure 103 may be formed by the front-side process.

Next, a working wafer is bonded on the interconnect structure 103, the substrate 101 is then flipped, and a thinning process is performed on the back-side surface 101b to thin the substrate 101 down to a thickness less than 3 µm. The preferred thickness of the thinned substrate 101 may range from 3 µm to 2 µm (see FIG. 1 B).

A patterned hard mask 107 is then formed on the back-side surface 101b and an etching process is performed by using the patterned hard mask 107 as a mask to form a plurality of deep trenches 105 and a recess 106 in the substrate 101. The patterned hard mask 107 consists of silicon oxide, silicon nitride or the combination thereof. In some embodiments of the present invention, each of the deep trenches 105 extends downward into the substrate 101 from the back-side surface 101b and exposes a corresponding STI 111. However, in some other embodiments of the present invention, the deep trenches do not align to the STIs 111 but stagger with them, such that the STIs 111 can not be exposed from the deep trenches. The recess 106 also extends downward into the substrate 101 from the back-side surface 101b and aligns to a front-side alignment mark 113 previously formed on the front-side surface 101a (see FIG. 1C) for the purposes of performing reticle alignment steps of the front-side process.

Figure 1C:
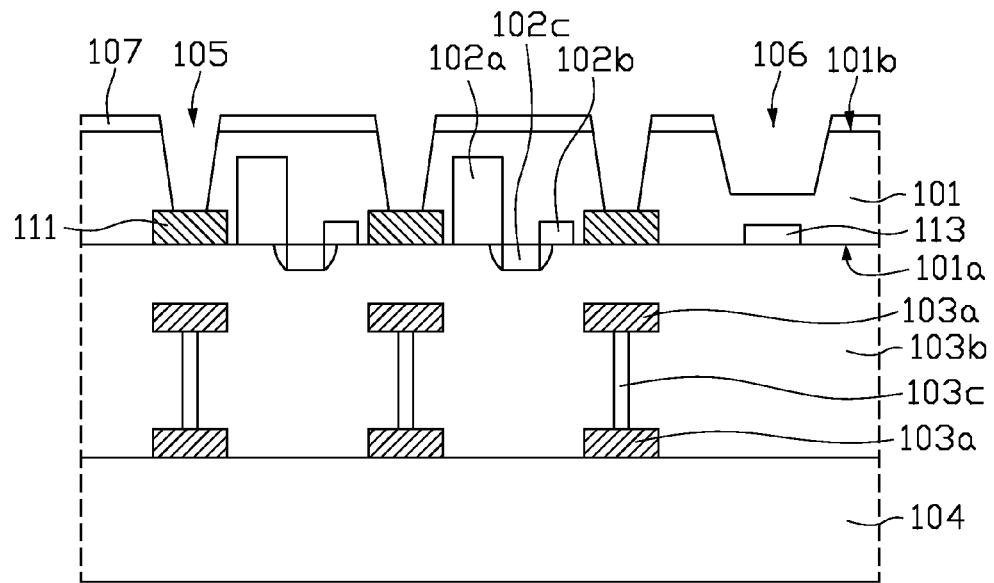

Although, the front-side alignment mark 113 illustrated in FIG. 1C is a single mark formed in the substrate 101, in some other embodiments, the front-side alignment mark 113 may comprise a plurality of elements either formed on the substrate 101 or formed in the substrate 101; and the front-side alignment mark 113 may be formed during, prior to or after the front-side process. In other words, the front-side alignment mark 113 comprises any structure which can serve as a mark being aligned by the recess 106 subsequently formed on the back-side surface 101b.

Figure 1D:
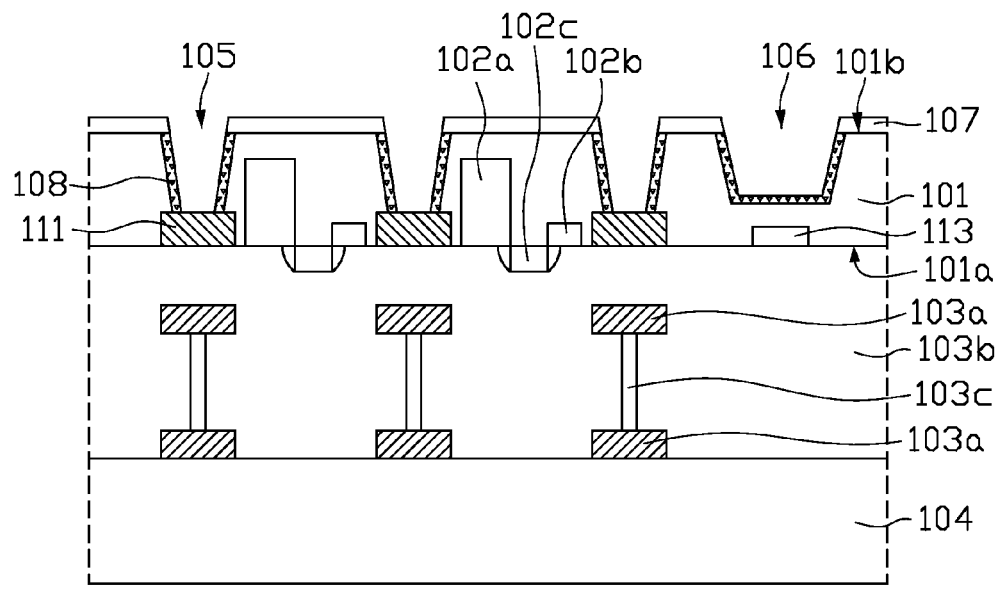

Thereafter, an ion implantation process is performed by using the patterned hard mask 107 as a mask to implant a plurality of p type dopants into the sidewalls of the deep trenches 105 and the recess 106, whereby a plurality of p+ doping layers 108 each surrounding the corresponding deep trenches 105 are formed in the substrate 101 (see FIG. 1D).

Figure 1E:
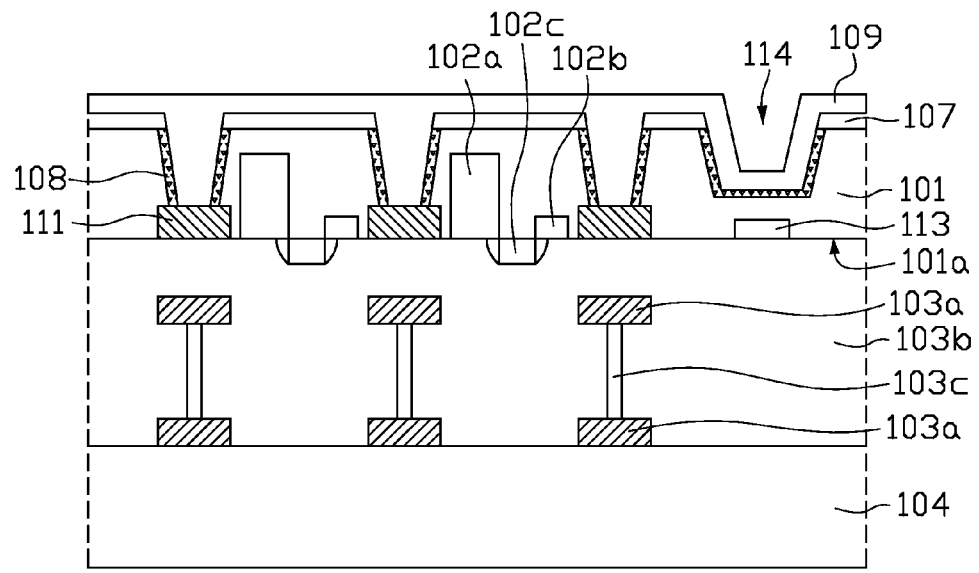
Figure 1F:
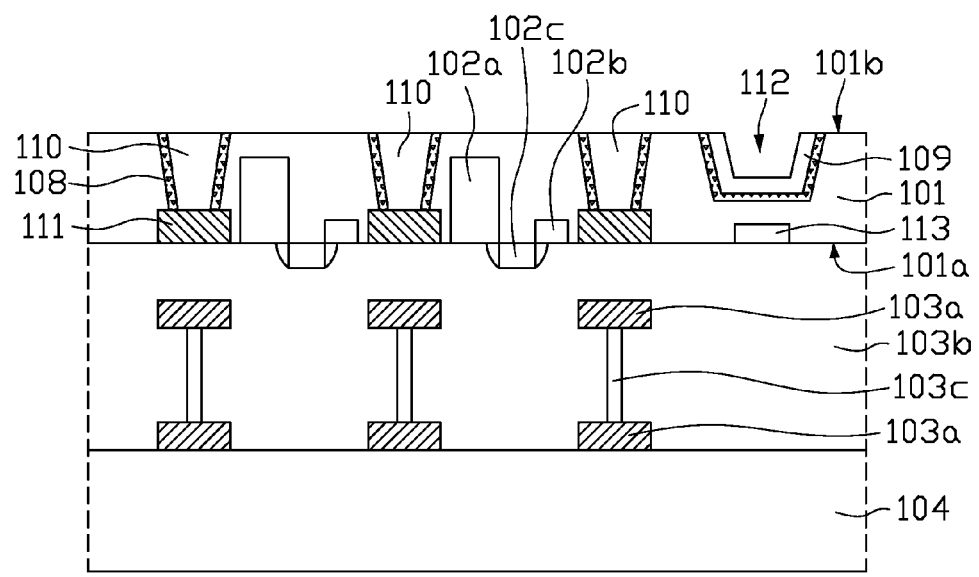
Figure 1G:
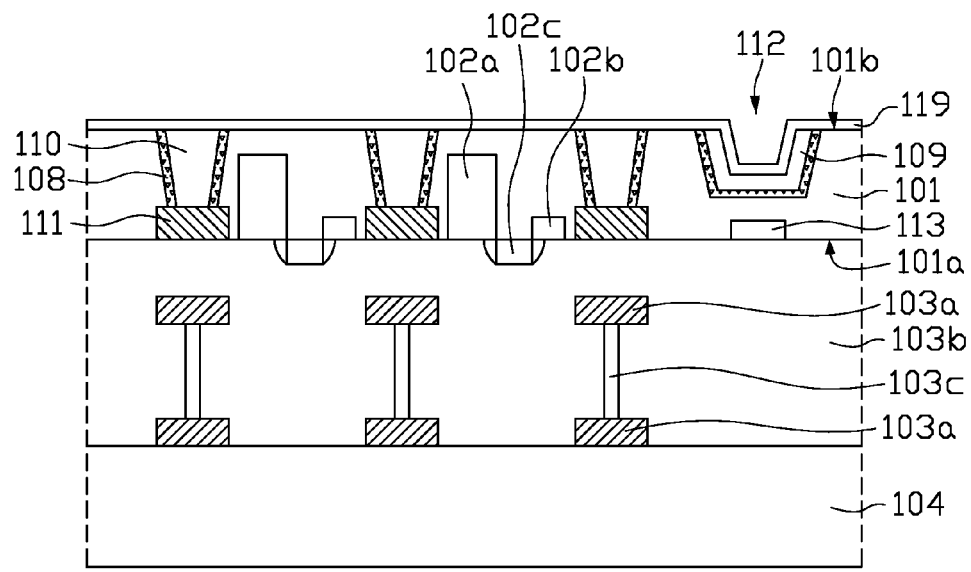
Figure 1H:
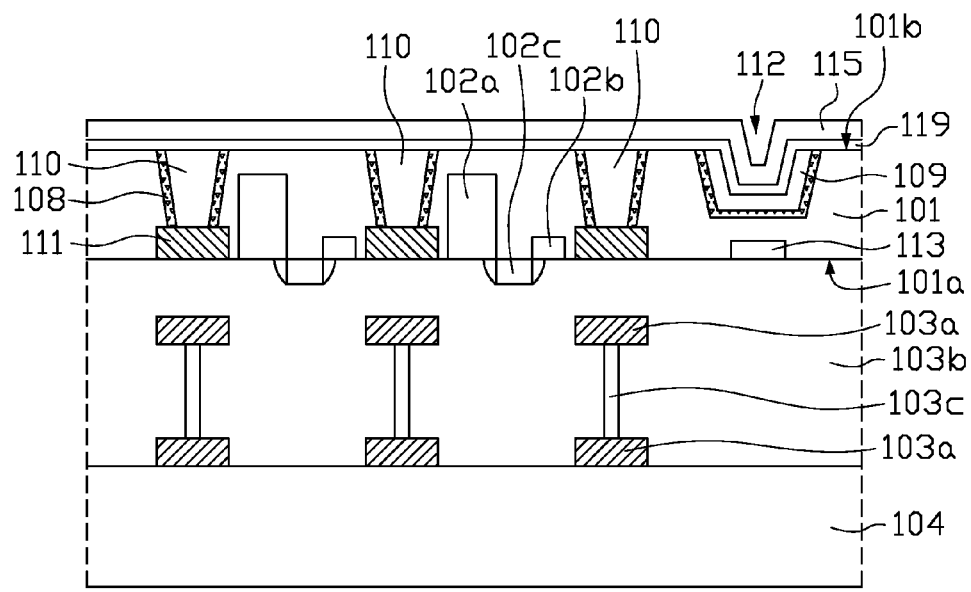
Figure 1I:
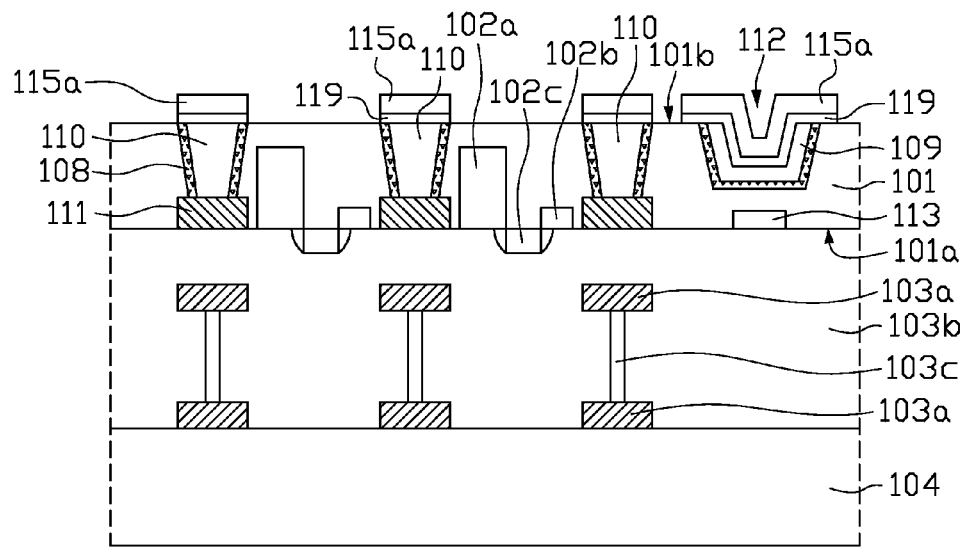

Subsequently, a dielectric material layer 109 is formed on the patterned hard mask 107 to fulfill the deep trenches 105 and partially fill the recess 106, so as to define another recess 114 in the recess 106 (see FIG. 1E). In the present embodiment, because the recess 106 has a size largely greater than that of the deep trenches 105, as well as, the deep trenches 105 and the recess 106 are formed by the same etching process, thus the recess may have a thickness less than the deep trench 105. Therefore, when the dielectric material layer 109 is formed to fulfill the deep trenches 105, the recess 106 may not be fulfilled, and the non-fulfilled portion of the recess 106 can be referred as the recess 114.

In some embodiments of the present invention, the dielectric material layer 109 is made of a plurality of anti-reflective materials. In the present embodiment, the dielectric material layer 109 is an ARC-multilayer structure constituted by a silicon oxide layer, a silicon nitride layer a silicon oxide layer stacked in sequence. But in some other embodiments, the dielectric material layer 109 is an ARC-multilayer structure constituted by a silicon oxide layer and a silicon nitride layer.

An optional planarization process, such as a chemical mechanical polishing (CMP) process, is then performed by using the back-side surface 101b of the substrate 101 as the stop layer to remove a portion of the dielectric material layer 109 in order to expose a portion of the substrate 101, meanwhile a plurality of dielectric isolators 110 used to isolate the photoelectric transducer devices 102 are formed, wherein each of the dielectric isolators 110 extends downwards in to the substrate 101 from the back-side surface 101b and connects with the corresponding STI 111. Simultaneously, a back-side alignment mark 112 is formed in the recess 106, wherein the back-side alignment mark 112 comprises a portion of the dielectric material layer 109 remaining in the recess 106 extending downwards in to the substrate 101 from the back-side surface 101b and refers to the front-side alignment mark 113 previously formed on the front-side surface 101a. In the present embodiment, the back-side alignment mark 112 aligns with the front-side alignment mark 113 (see FIG. 1F). However, in some other embodiment, the back-side alignment mark 112 dose not aligns to the front-side alignment mark 113 directly but makes a reference to the front-side alignment mark 113 by a predetermined spatial relation, e.g. a coordinate diagram.

Next, a surface treatment is optionally performed on the on the substrate 101, the dielectric isolator 110 and the back-side alignment mark 112, and an optional metal shielding layer 115a is then formed on the dielectric isolator 110 and the back-side alignment mark 112. In some embodiments of the present invention, the surface treatment comprises the following steps: An ion implantation process and a laser annealing process are performing on the back-side surface 101b to form a p+ doping region (not shown) in the substrate 101. An ARC layer 119 is then formed on the back-side surface 101b, the dielectric isolator 110 and the sidewalls and the bottom of the recess 114 (see FIG. 1G). The formation of the optional metal shielding layer 115a comprises steps of forming a metal layer 115 on the back-surface 101b, the dielectric isolator 110 and the sidewalls and the bottom of the recess 114 (see FIG. 1H), and patterning the metal layer 115 to remaining a portion of the metal layer 115 overlaying on the dielectric isolator 110 and partially filling the recess 114 (see FIG. 1I).

Figure 1J:
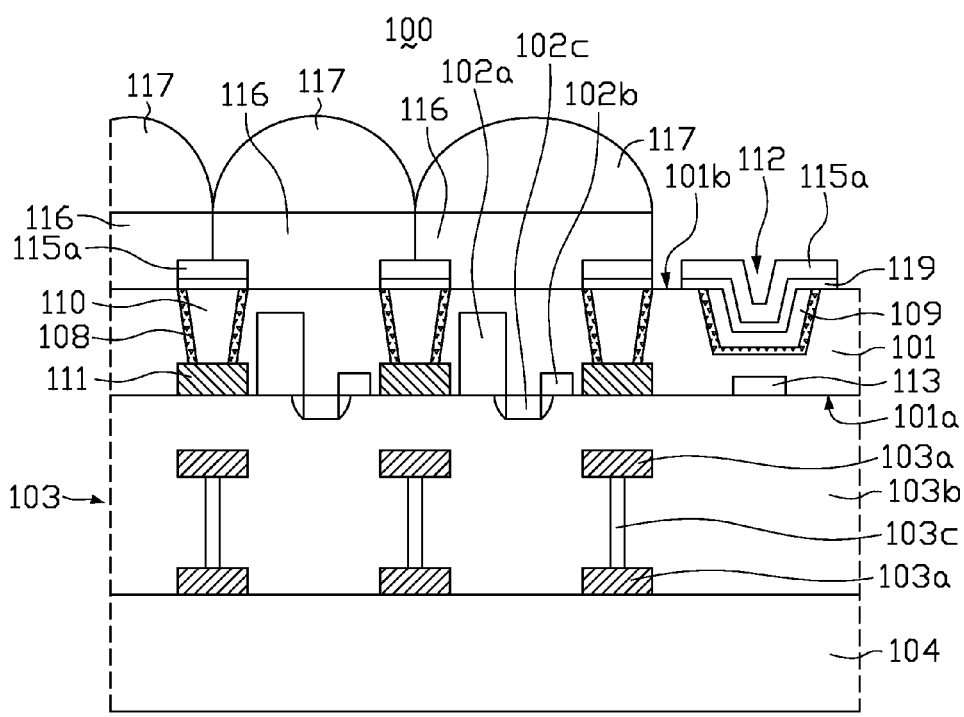

Afterward, a plurality of color filters 116 and a plurality of lenses 117 are formed on the back-side surface 101b and the dielectric isolator 110 and meanwhile the MOS image sensor 100 shown as FIG. 1J is formed.

Referring to FIG. 1J again, the MOS image sensor 100 fabricated by the aforementioned method may comprise a substrate 101, a plurality of photoelectric transducer devices 102, an interconnect structure 103, a plurality of dielectric isolator 110, a back-side alignment mark 112, an optional metal shielding layer 115a, a color filter 116 and a plurality of lenses 117. Wherein, the substrate 101 has a front-side surface 101a and a back-side surface 101b opposite to the front-side surface 101a. The photoelectric transducer devices 102 are formed on the front-side surface 101a. The interconnect structure 103 is disposed on the substrate 101 adjacent to the front-side surface 101a. The dielectric isolator 110 extends downwards into the substrate 101 from the back-side surface 101b in order to isolate the photoelectric transducer devices 102. The back-side alignment mark 112 extends downwards into the substrate 101 from the back-side surface 101b and references to a front-side alignment mark 113 previously formed on the front-side surface 101a. The color filter 116 and the lenses 117 are formed on the back-side surface 101b and the dielectric isolator 110. The optional metal shielding layer 115a is disposed between the dielectric isolator 110 and the color filter 116.

Figure 2:
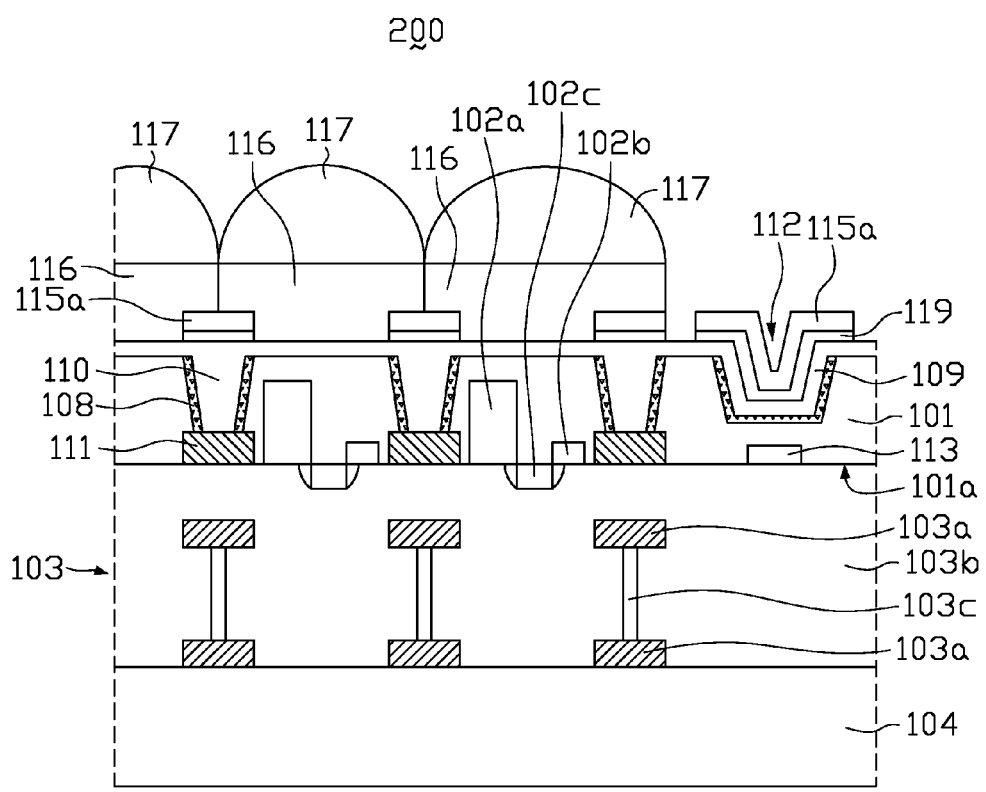
FIG. 2 illustrates a cross sectional view of a MOS image sensor in accordance with another embodiment of the present invention.

Since the gap-fill procedural of the embodiments of the present invention is arranged after the front-side process which requires precise alignment, thus, in some preferred embodiments, the optional the planarization process may be omitted. Therefore, the dielectric material layer 109 can be remained as-deposited; and after the subsequent process as described above are carried out, the MOS image sensor 200 shown as FIG. 2 can be formed.

In accordance with the aforementioned embodiments of the present invention, an image sensor and the fabricating method thereof are provided, wherein a plurality of photoelectric transducer devices and an interconnect structure are firstly formed on a front-side surface of a substrate. At least one dielectric isolator extending downwards into the substrate from a back-side surface of the substrate opposite to the back-side surface is then formed in order to isolate the photoelectric transducer devices, whereby both of the incident light passing into the substrate and the photo-carriers generated in the substrate can be effectively isolated. Therefore, the electrical and optical crosstalk between two adjacent photoelectric transducer devices can be avoided.

In addition, because the formation of the dielectric isolator and the front-side process for forming the photoelectric transducer devices and the interconnect structure are respectively performed on opposite surface of the substrate, the high temperature generated by the liner oxidation process and the gap-fill material densification process for fabricating the dialectic isolator may not interfere the performance of two adjacent photoelectric transducer devices, and the quality of the interconnect structure which is formed on the front-side surface shall not be adversely affect by a u-scratch resulted from the planariztion process (e.g. a chemical mechanical polishing process) performed on the back-side surface.

Furthermore, since a back-side alignment mark referencing to a front-side alignment mark previously formed on the front-side surface of the substrate for the front-side process can be simultaneous with the formation of the dielectric isolator on the back-side surface by the same steps, thus the subsequent process can be performed more precisely without performing any additional process. In other words, the processing accuracy of the image sensor can be significantly increased without increasing any additional cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An image sensor comprising:
   a substrate, having a front-side surface and a back-side surface opposite to the front-side surface;
   an interconnect structure, disposed on the front-side surface;
   a plurality of photoelectric transducer devices, formed on the front-side surface;
   at least one dielectric isolator, extending downwards into the substrate from the back-side surface in order to isolate the photoelectric transducer devices;
   a back-side alignment mark, comprising a $p^+$ doping layer, a dielectric layer, an anti-reflective coating layer and a metal shielding layer formed in a recess extending downwards into the substrate from the back-side surface;
   wherein the $p^+$ doping layer is formed in the recess of the back-side alignment mark and on sidewalls of the at least one dielectric isolator before the dielectric layer, the anti-reflective coating layer and the metal shielding layer are disposed in the recess in a manner of referencing to a front-side alignment mark previously formed on the front-side surface.

2. The image sensor according to claim 1, wherein the dielectric isolator comprises a plurality of anti-reflective coating (ARC) layers.

3. The image sensor according to claim 1, wherein the $p^+$ doping layer is disposed in the substrate and surrounds the sidewalls and a bottom of the dielectric isolator.

4. The image sensor according to claim 1, further comprising a shallow trench isolator (STI) extending downwards into the substrate from the front-side surface and connecting to the dielectric isolator.

5. The image sensor according to claim 1, wherein the back-side alignment mark aligns to the front-side alignment mark or makes a reference to the front-side alignment mark by a predetermined spatial relation.

6. The image sensor according to claim 1, further comprising a color filter and a plurality of lenses disposed on the back-side surface.

7. The image sensor according to claim 6, further comprising a metal shielding layer disposed between the color filter and the dielectric isolator.

* * * * *